United States Patent [19]

Miyano

[11] Patent Number: 5,610,390
[45] Date of Patent: Mar. 11, 1997

[54] SOLID-STATE IMAGE PICKUP DEVICE HAVING MICROLENSES EACH WITH DISPLACED OPTICAL AXIS

[75] Inventor: Hitoshi Miyano, Saitama-ken, Japan

[73] Assignee: Fuji Photo Optical Co., Ltd., Saitama-ken, Japan

[21] Appl. No.: 527,329

[22] Filed: Sep. 12, 1995

[30] Foreign Application Priority Data

Oct. 3, 1994 [JP] Japan ................................. 6-238825

[51] Int. Cl.$^6$ ......................................................... H01J 3/14
[52] U.S. Cl. ...................... 250/216; 250/208.1; 250/239; 257/432
[58] Field of Search ................................. 250/208.1, 216, 250/226, 214.1, 239; 354/402–408, 410, 430, 286; 359/819, 822, 823, 738; 257/432–436

[56] References Cited

U.S. PATENT DOCUMENTS 5,250,798  10/1993  Iizuka et al. ............................. 250/216
5,324,930   6/1994  Jech, Jr. ................................... 250/216

*Primary Examiner*—Que T. Le
*Attorney, Agent, or Firm*—Sixbey, Friedman, Leedom & Ferguson, P.C.; Gerald J. Ferguson, Jr.

[57] ABSTRACT

A solid-state image pickup device capable of forming a high quality image over the entire pixel constituent element region of a solid-state image pickup element even when an image taking lens system has a close exit pupil. A solid-state image pickup device has a solid-state image pickup element consisting of a plurality of constituent pixel elements arranged in a predetermined pattern and a plurality of pixel openings each of which defines the shape of an opening of the constituent pixel element, and a plurality of microlenses each of which is disposed immediately in front of each pixel opening. The optical axis of the microlens is displaced toward the optical axis of the image taking lens system in relation to the center axis of the pixel opening by the amount of displacement corresponding to a center distance between the optical axis of the image taking lens system and the center axis of the pixel opening. With this arrangement, even if the image taking lens system has a close exit pupil, the luminous flux obtained by the microlens is efficiently taken into the pixel opening irrespective of the position of the pixel constituent element on the solid-state image pickup element.

2 Claims, 4 Drawing Sheets

SOLID-STATE IMAGE PICKUP DEVICE HAVING MICROLENSES EACH WITH DISPLACED OPTICAL AXIS

BACKGROUND OF THE INVENTION

1. Field of the Invention

The present invention relates to a solid-state image pickup device in which a microlens is disposed immediately in front of a pixel opening which defines the shape of the opening of each constituent pixel element of a solid-state image pickup device.

2. Description of the Prior Art

In recent years, with the demand for higher quality images, a still image has become constituted of an increased number of pixels. For this reason, with respect to solid-state image pickup elements forming a light receiving section of a still video camera, a movie vide camera, and an electrical vide endoscope, the size of each pixel constituent element tends to inevitably become smaller. A pixel opening which defines the shape of the opening of each pixel constituent element (that is, the amount of light which enters each pixel constituent element) is formed only in a part of the over the entire surface of each pixel constituent element, and hence the amount of light to be detected is likely to become insufficient.

Conventionally, to prevent this, a microlens having an aperture larger than the pixel opening is disposed immediately in front of each pixel opening. The shortage of light entering each pixel constituent element is compensated by light-collecting action of this microlens, thereby preventing a drop in detection sensitivity.

For example, Unexamined Japanese Patent Publn. No. Hei-5(1993)-203837 discloses a solid-state image pickup device as shown in FIG. 1. A group of on-chip microlenses 18 consisting of a plurality of microlenses 20 is disposed on a chip-like solid-state image pickup element 16 which comprises a plurality of pixel constituent elements 12 arranged in a predetermined pattern, in such a way that each microlens 20 is positioned just above an each pixel opening 14. Luminous flux designated by the solid line arrow in the drawing entering the microlens 20 along the optical axis thereof is converged on the area of the pixel opening 14 by virtue of the effect of a convex lens of the microlens 20, thereby resulting in a solid-state image pickup element 16 of improved light converging efficiency and sensitivity.

However, the following problems stem from the previously mentioned solid-state image pickup device.

Specifically, if an image taking lens system disposed in front of the solid-state image pickup device has a sufficiently distant exit pupil, no particularly significant problem will arise. In contrast with this, if an image taking lens system having a close exit pupil is disposed in front of the solid-state image pickup device, light will enter the microlens 20 in an oblique direction with respect to the optical axis of the microlens 20 as the pixel constituent element moves away from the optical axis of the image taking lens system, as designated by a broken line. As a result of this, the point at which the light converges deviates from the pixel opening 14, and hence it becomes possible for the pixel opening 14 to acquire only a part of the luminous flux entering the microlens 20. For this reason, an image formed in the solid-state image pickup element 16 has a dark shade along the periphery of the image.

SUMMARY OF THE INVENTION

The present invention is conceived to overcome the aforementioned drawbacks in the prior art, and the object of the present invention is to provide a solid-state image pickup device capable of producing a high quality image over the entire pixel constituent element region of a solid-state image pickup element even when an image taking lens system has a close exit pupil.

In one aspect of the present invention, the above object is achieved by appropriately displacing the optical axis of a microlens toward the optical axis of an image taking lens system in relation to the center axis of a pixel opening, differing from a conventional solid-state image pick-up device in which the center axis of a pixel opening is aligned to the optical axis of a microlens. As a result of this a degree of coincidence between a position at which light entered in an oblique direction with respect to the optical axis of the microlens converges and the pixel opening is improved.

More specifically, the above object is attained by a solid-state image pickup device including a solid-state image pickup element which consists of a plurality of pixel constituent elements arranged in a predetermined pattern and a plurality of pixel openings for defining the shape of an opening of each pixel constituent element, and microlenses each of which is disposed immediately in front of each pixel element, the improvement being characterized by that the optical axis of the microlens is displaced toward the optical axis of an image taking lens system disposed in front of the solid-state image pickup device, in relation to the center axis of the pixel opening by the amount of displacement corresponding to a center distance between the optical axis of the image taking lens system and the center axis of the pixel opening.

In the above description, as a matter of course, the amount of displacement corresponding to the center distance can be set to the amount of displacement in proportion to the center distance. However, the amount of displacement is not always limited to this but may be set to another factor so long as the amount of displacement increases as the center distance becomes larger.

Further, the positional relationship in each pixel constituent element between the pixel opening and the microlens is relative. This positional relationship includes the positional relationship in which the optical axis of the microlens is displaced toward the optical axis of the photographing lens in relation to the pixel opening, and the relationship in which the center axis of the pixel opening is displaced toward the optical axis of the image taking lens system in relation to the optical axis of the microlens.

As can be seen from the above description, according to the present invention, the optical axis of the microlens is displaced toward the optical axis of the image taking lens system in relation to the center axis of the pixel opening by the amount of displacement corresponding to a center distance between the optical axis of the image taking lens system and the center axis of the pixel opening. Hence, even if the image taking lens system has a close exit pupil, a luminous flux acquired by the microlens can be efficiently taken into the opening of the pixel constituent element irrespective of the position of the pixel constituent element on the solid-state image pickup element.

Therefore, according to the present invention, if the image taking lens system has a close exit pupil, it is possible to obtain a high quality image over the entire pixel constituent element region of the solid-state image pickup element.

In this case, according to a second aspect of the present invention, if the amount of displacement is set using the following equation $$\delta h = f \cdot h / H,$$

it becomes possible to take a luminous flux into the pixel opening with the maximum efficiency which can be obtained for the position of the exit pupil of the image taking lens system.

BRIEF DESCRIPTION OF THE DRAWINGS

FIGS. 3A to 3B are schematic representations showing the operation of the solid-state image pickup device shown in FIG. 1, wherein FIG. 3A shows the relationship between a luminous flux entering in a pixel opening and the optical axis of the optical axis of an image taking lens system, FIG. 3B shows the amount of displacement between the luminous flux after having passed through a microlens and the optical axis of the microlens, and FIG. 3C schematically shows the amount of displacement and other factors.

DESCRIPTION OF THE PREFERRED EMBODIMENT

With reference to the accompanying drawings, a preferred embodiment of the present invention will now be described.

Figure 1:
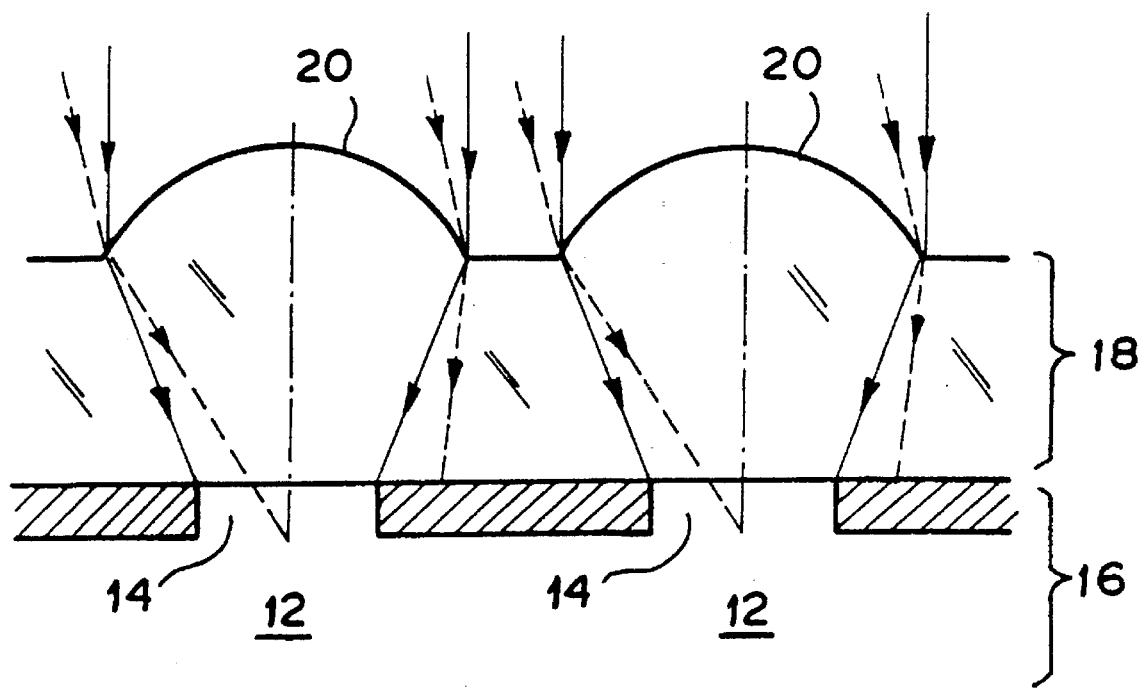
FIG. 1 is a side cross-sectional view showing the principal elements of a conventional solid-state image pickup device.
Figure 2:
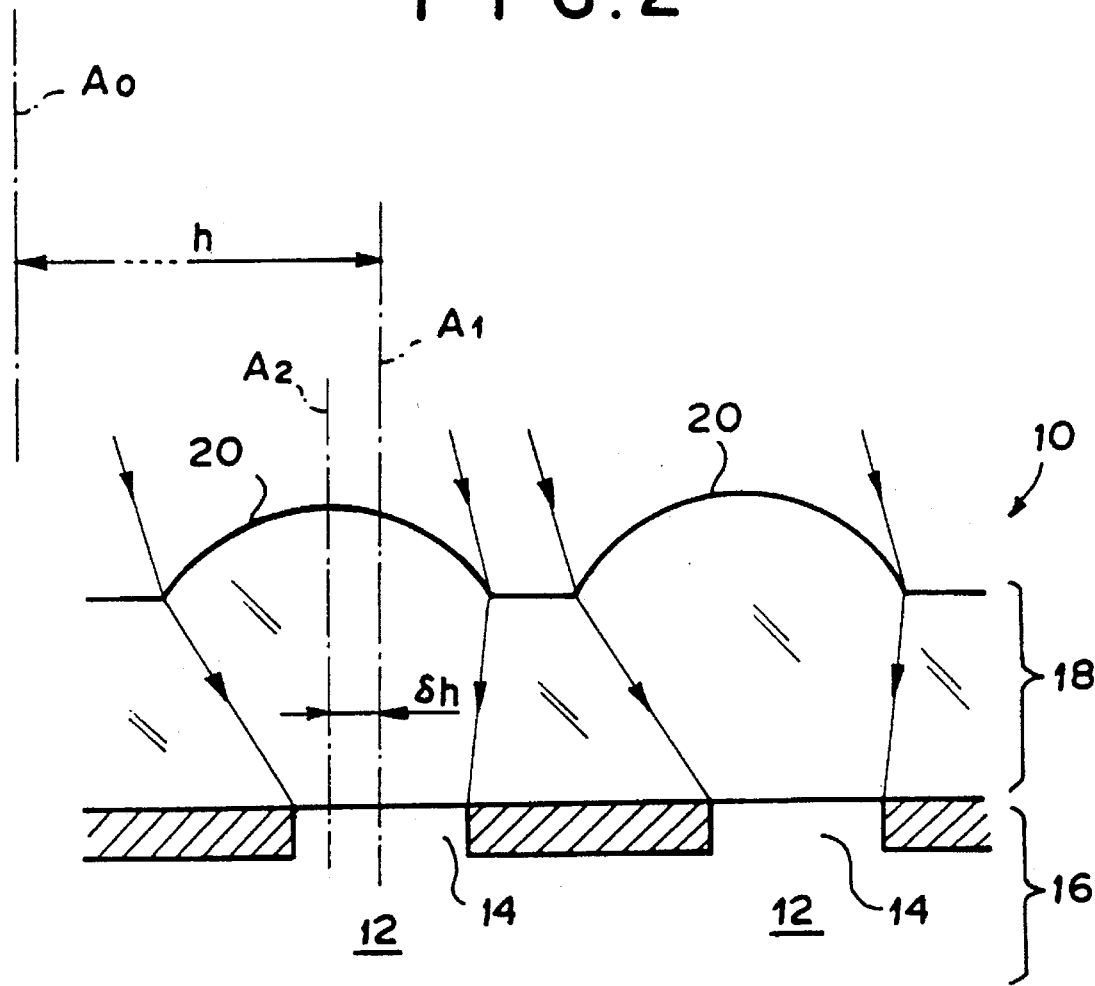
FIG. 2 is a side cross-sectional view showing the principal elements of a solid-state image pickup device according to one embodiment of the present invention.

FIG. 2 is a side cross-sectional view showing the principal elements of a solid-state image pickup device according to one embodiment of the present invention.

A solid-state image pickup device 10 is made up of a chip-like solid-state image pickup element 16 consisting of a plurality of constituent pixel elements arranged in a matrix patter and a plurality of pixel openings 14 each of which defines the shape of an opening of each constituent pixel element 12, and a group of on-chip microlenses disposed immediately in front of the solid-state image pickup element 16. A plurality of microlenses (plano-convex lenses) 20 forming the group of on-chip microlenses are respectively disposed immediately in front of the pixel openings 14. An image taking lens system (not shown) having a close exit pupil is disposed in front of the solid-state image pickup device 10. The solid-state image pickup element 16 is disposed at an imaging point of this image taking lens system.

As designated by the solid line arrow in FIG. 2, the optical axis $A_2$ of the microlens 20 is displaced toward the optical axis $A_0$ of the image taking lens system in relation to the center axis $A_1$ of the pixel opening 14 by the amount of displacement $\delta h$ corresponding to a center distance h (the height of an image) between the optical axis $A_0$ of the image taking lens system and the center axis $A_1$ of the pixel opening 14.

The amount of displacement $\delta h$ is set using the following equation $$\delta h = f \cdot h / H$$

where H is an axial distance between the exit pupil of the image taking lens system and the microlens 20, and f is the focal length of the microlens 20.

The above expression will now be described in more detail hereunder.

Figure 3A:
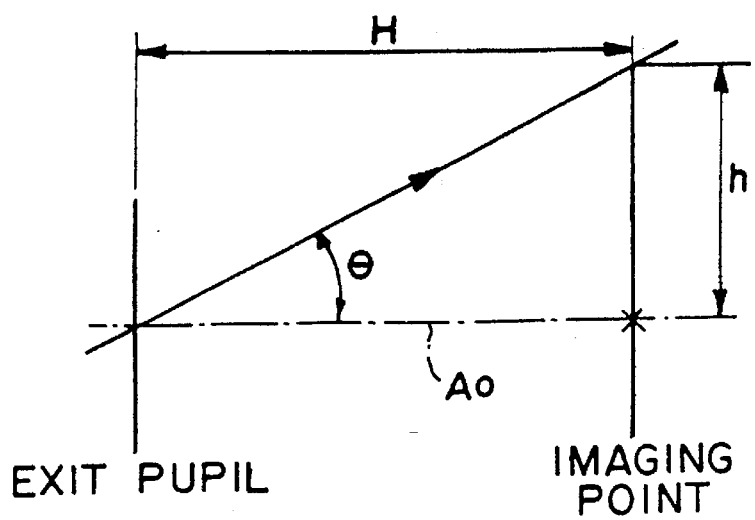

Specifically, as shown in FIG. 3A, the angle $\theta$ of the principal ray of a luminous flux entering an arbitrary pixel opening (a ray passing through a point of intersection between the ray and the optical axis $A_0$ at the exit pupil) becomes $$\tan \theta = h/H.$$

Figure 3B:
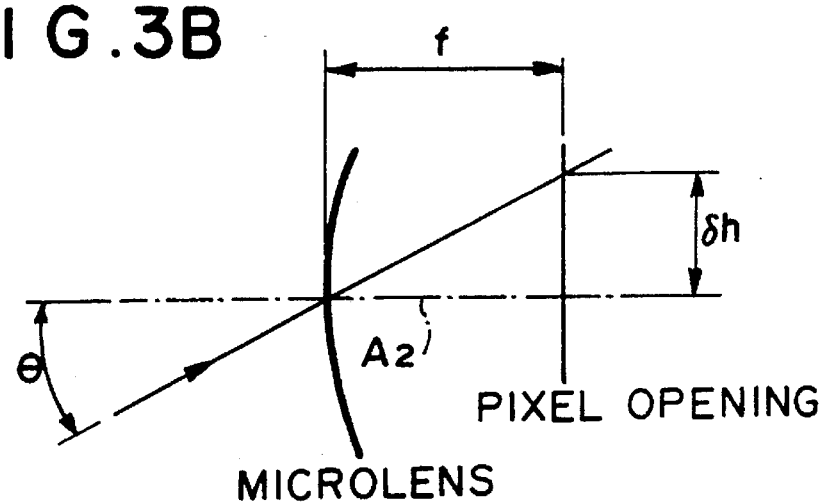

The amount of displacement between the principal ray after having passed through the microlens and the optical axis $A_2$ of the microlens is defined by $$f \cdot \tan \theta$$

as shown in FIG. 3B. Therefore, the amount of displacement $\delta h$ of the microlens 20 becomes $$\delta h = f \cdot h / H.$$

Figure 3C:
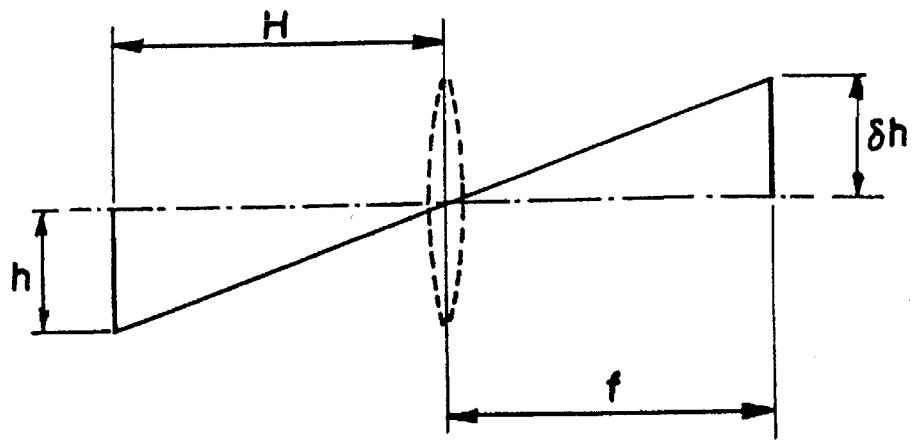

FIG. 3C schematically shows this expression. The amount of displacement $\delta h$ is proportional to the image height H but is inversely proportional to the distance H between the exit pupil and the imaging point of the image taking lens system.

Figure 4:
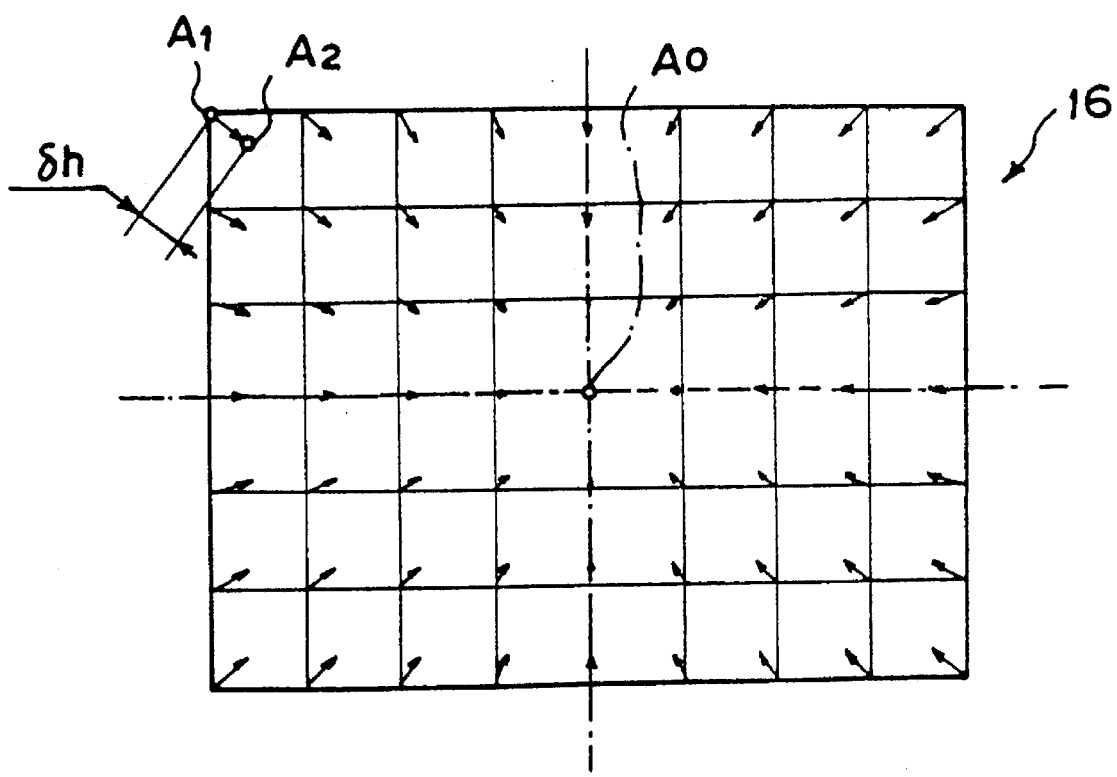
FIG. 4 is a schematic representation showing the positional relationship between a pixel opening and a microlens for all constituent pixel elements of a solid-state image pickup element.

FIG. 4 schematically shows the positional relationship between the pixel opening 14 and the microlens 12 for all of the constituent pixel elements 12 of the solid-state image pickup element 16. In the drawing, each point of intersection of vertical and horizontal lines (i.e., points of a grid) represents the position of the center axis $A_1$ of each pixel opening 14, and the arrow extending from each point of intersection represents the direction of displacement of the microlens 20 and the amount of displacement $\delta h$. The optical axis $A_2$ of the microlens 20 is positioned at the tip end of each arrow.

As previously described in detail, in the present embodiment, the optical axis $A_2$ of the microlens 20 is displaced toward the optical axis $A_0$ of the image taking lens system in relation to the center axis $A_1$ of the pixel opening 14 by the amount of displacement $\delta h$ corresponding to a center distance h between the optical axis $A_0$ of the image taking lens system and the center axis $A_1$ of the pixel opening 14. With such an arrangement, even if the image taking lens system has a close exit pupil, it becomes possible to efficiently take the luminous flux obtained by the microlens 20 into the pixel opening 14 irrespective of the position of the pixel constituent element on the solid-state image pickup element 16.

Therefore, according to this embodiment, even if an image taking lens system has a close exit pupil, it is possible to form a high quality image over the entire pixel constituent element region of the solid-state image pickup element.

Further, in this embodiment, since the amount of displacement is set using the equation as defined by $$\delta h = f \cdot h / H,$$

it becomes possible to take a luminous flux into a pixel opening with the maximum efficiency which can be obtained for the position of the exit pupil of the image taking lens system. In this case, similar results can be obtained even if a distance between the apex of a convex surface of the microlens 20 and the pixel opening 14 is used in lieu of the focal length f of the microlens 20 used in the above equation.

While this invention has been described with reference to an illustrative embodiment, this description is not intended to be construed in a limiting sense. Various modifications of the illustrative embodiment, as well as other embodiments of the invention, will be apparent to those who are versed in the art upon reference to this description. It is, therefore, contemplated that the appended claims will cover any such modifications or embodiments as fall within the true scope of the invention.

What is claimed is:

1. A solid-state image pickup device including a solid-state image pickup element which consists of a plurality of constituent pixel elements arranged in a predetermined pattern and a plurality of pixel openings for defining the shape of an opening of each constituent pixel element, and microlenses each of which is disposed immediately in front of each pixel element, the improvement being characterized by that the optical axis of the microlens is displaced toward the optical axis of an image taking lens system disposed in front of the solid-state image pickup device, in relation to the center axis of the pixel opening by the amount of displacement corresponding to a center distance between the optical axis of the image taking lens system and the center axis of the pixel opening.

2. The solid-state image pickup as defined in claim 1, wherein assuming that the amount of displacement is $\delta h$, the amount of displacement $\delta h$ is set using the equation $$\delta h = f \cdot h / H$$

where h is a center distance between the optical axis of the image taking lens system and the center axis of the pixel opening, H is an axial distance between the exit pupil of the image taking lens system and the microlens 20, and f is the focal length of the microlens.

\* \* \* \* \*